United States Patent [19]

Ueyama

[11] Patent Number: 5,093,694
[45] Date of Patent: Mar. 3, 1992

[54] SEMICONDUCTOR VARIABLE CAPACITANCE DIODE WITH FORWARD BIASING

[76] Inventor: Ken-ichi Ueyama, c/o 19-26, Matsugahana-Cho 4-Chome, Ten-nohji-Ku, Osaka, 543, Japan

[21] Appl. No.: 677,154

[22] Filed: Mar. 29, 1991

[30] Foreign Application Priority Data

Apr. 6, 1990 [JP] Japan ................................. 2-91865

[51] Int. Cl.⁵ ........................................... H01L 29/92
[52] U.S. Cl. ......................................... 357/14; 357/51; 357/54
[58] Field of Search ............................. 357/14, 51, 54

[56] References Cited

U.S. PATENT DOCUMENTS

| | | | |
|---|---|---|---|
| 3,400,310 | 9/1968 | Dorendorf et al. | 357/14 X |
| 3,922,571 | 11/1975 | Smith | 307/296 |
| 4,214,252 | 7/1980 | Goerth | 357/14 X |
| 4,745,454 | 5/1988 | Erb | 357/14 X |
| 4,903,086 | 2/1990 | Hackley | 357/14 |

FOREIGN PATENT DOCUMENTS 58-43579 3/1983 Japan .

OTHER PUBLICATIONS

Applied Physics Letters-vol. 2, No. 8, Apr. 15, 1972, pp. 269-271, T. Yamamoto et al., "Thin-Mis-Structure Negative-Resistance Diode".

*Primary Examiner*—William Mintel
*Attorney, Agent, or Firm*—Darby & Darby

[57] ABSTRACT

A semiconductor variable capacitance diode comprising an insulating layer interposed between a laminated body of a first conductivity type semiconductor layer and a second type conductivity semiconductor layer and an electrode. An application of forward bias voltage to the electrode induces a variable capacitance proportional to the applied forward bias voltage.

12 Claims, 6 Drawing Sheets

SEMICONDUCTOR VARIABLE CAPACITANCE DIODE WITH FORWARD BIASING

BACKGROUND OF THE INVENTION

1. Field of the Invention

The present invention relates to a semiconductor variable capacitance diode.

2. Description of Related Art

A MOS Varactor having a MOS structure and a P-N junction diode having a P-N junction structure have been known as a semiconductor variable capacitance diode. The present invention relates to the latter.

Said P-N junction diode comprises a laminated body consisting of a P-type semiconductor layer 1 and an N-type semiconductor layer 2 and electrodes 4, 5 provided on both sides of said laminated body, as shown in FIG. 1. The P-N junction diode is used with a backward voltage applied, as shown in the drawing. A junction capacitance of this P-N junction diode is changed depending upon said applied voltage, as shown in FIG. 2. Said capacitance is inversely proportional to a square root of the voltage. It is the reason why the capacitance is changed that an extension of a depletion layer of P-N junction is dependent upon the applied voltage. Since said extension of said depletion layer resulting from a change of the applied voltage is limited, a ratio of a change of the capacitance to said change of the voltage can not be increased. In order to solve this problem, for example, a device, in which a gradient of a distribution of concentration of impurities in said P-type semiconductor layer 1 and said N-type semiconductor layer 2 is steepened (density the junction side) has been adopted but it has not been sufficient.

In addition, though it is desirable for a variable capacitance diode to have a large performance index Q, Q can not be increased because the application of backward voltage naturally increases its series resistance.

Furthermore, the application of backward voltage naturally produces a small leakage current.

SUMMARY OF THE INVENTION

It is an object of the present invention to provide an ideal semiconductor variable capacitance diode showing an increased ratio of a change of a capacitance to a change of a voltage, an increased performance index Q and a reduced leakage current and a semiconductor device using the same.

It is another object of the present invention to provide a semiconductor variable capacitance diode capable of increasing capacitance with an increase of an applied voltage and a semiconductor device using the same.

The above and further objects and features of the invention will more fully be apparent from the following detailed description with accompanying drawings.

DETAILED DESCRIPTION OF THE PREFERRED EMBODIMENTS

Figure 1:
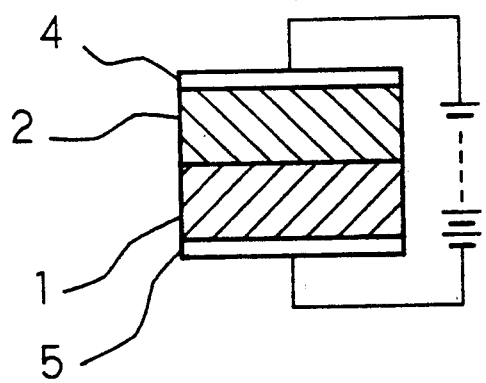
FIG. 1 is a schematic sectional view showing the conventional semiconductor variable capacitance diode.
Figure 2:
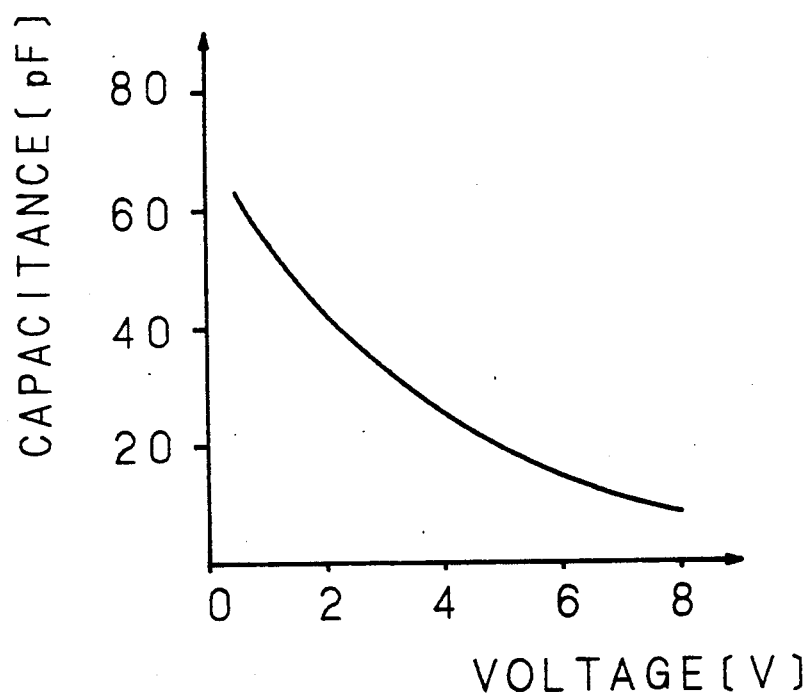
FIG. 2 is a capacitance-voltage characteristic diagram of the conventional variable capacitance diode.
Figure 3:
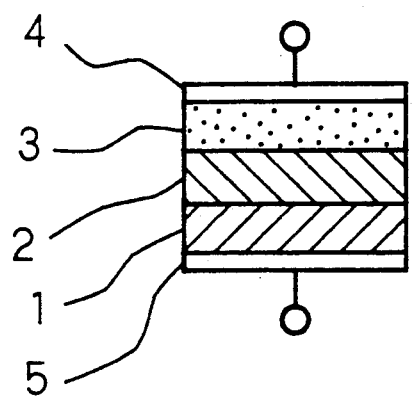
FIG. 3 is a schematic sectional view showing a first preferred embodiment of a semiconductor variable capacitance diode according to the present invention.

FIG. 3 is a schematic sectional view showing a semiconductor variable capacitance diode. Said semiconductor variable capacitance diode comprises a laminated body consisting of a P-type semiconductor layer 1, a N-type semiconductor layer 2 and a dielectric layer 3 and electrodes 4, 5 provided on both sides of said laminated body.

Figure 4:
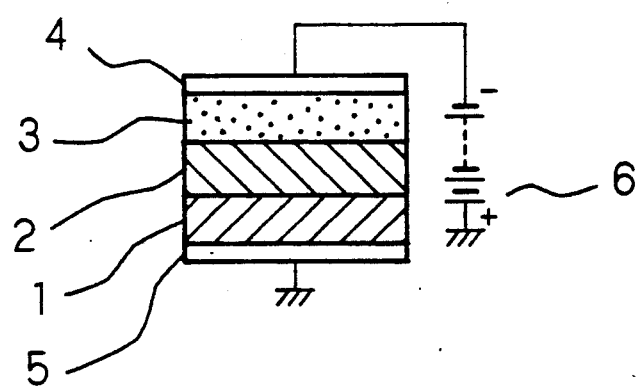
FIG. 4 is a schematic sectional view showing a connecting condition of said semiconductor variable capacitance diode according to the present invention with a power source.
Figure 5:
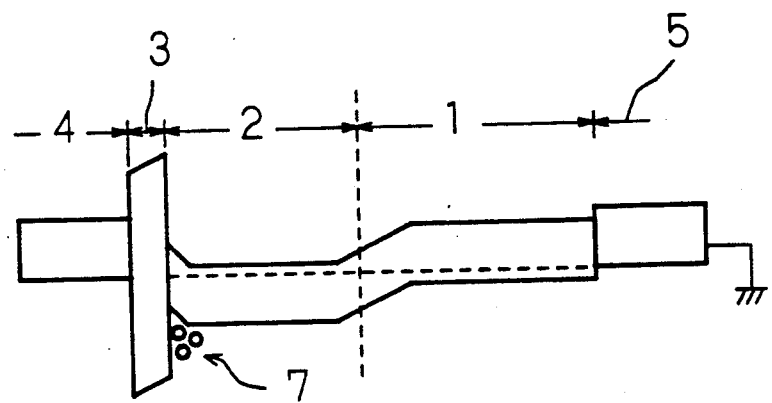
FIG. 5 is an energy band diagram under the condition shown in FIG. 4.
Figure 6:
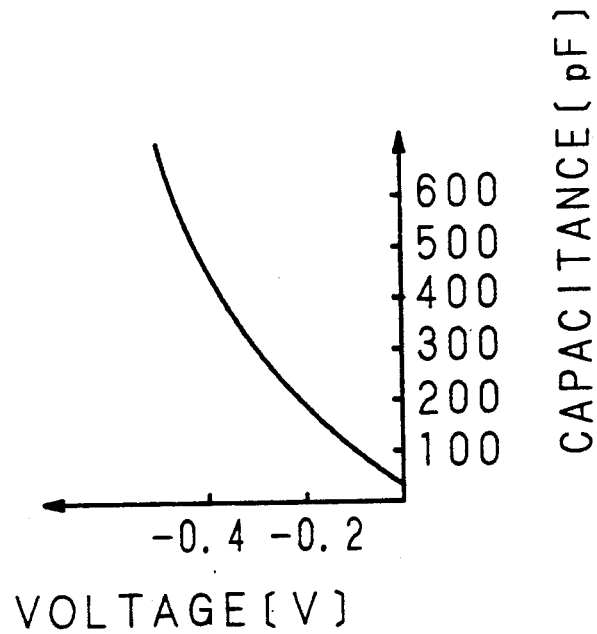
FIG. 6 is a capacitance-voltage characteristic diagram of the diode according to the present invention.

The semiconductor variable capacitance diode according to the present invention is connected with a power source 6 forwardly, as shown in FIG. 4. Holes 7 are injected from said P-type semiconductor layer 1 into said N-type semiconductor layer 2 in the known manner by connecting the semiconductor variable capacitance diode with said power source 6 forwardly. FIG. 5 shows an energy band structure of the diode according to the present invention in the case where a forward voltage is applied, as shown in FIG. 4. Said holes 7 injected from the P-type semiconductor layer 1 into the N-type semiconductor layer 2 arrive at a boundary surface of the N-type semiconductor layer 2 and said dielectric layer 3. Accordingly, a capacitor comprising the holes 7, the dielectric layer 3 and said electrode 4 is formed. A forward electric current of a P-N junction diode consisting of a P-type semiconductor layer and an N-type semiconductor layer is exponentially increased with an increase of said applied voltage, as known. According to the construction of the present invention, a diode current does not flow because the dielectric layer is disposed between the electrodes 4, 5, but the quantity of the holes 7 is exponentially increased with said increase of the applied voltage similarly. Since the number of the holes 7 corresponds to an area of a capacitor electrode on one side of the dielectric layer 3, said number of the holes 7 is nearly directly proportional to a value of capacitance. Accordingly, as shown in FIG. 6, said capacitance is exponentially changed with a change of the voltage. This shows that the ratio of a change of capacitance is remarkably increased in comparison with the conventional variable capacitance diode in which the capacitance is inversely proportional to the square root of the voltage.

And, the semiconductor variable capacitance diode according to the present invention shows characteristics that the value of capacitance is increased with an increase of the applied voltage which is of opposite polarity to that of the conventional variable capacitor diode. Moreover, in principle, the value of capacitance can be increased up to the quantity desired with an increase of the holes 7, in short an increase of the voltage.

Next, as to the series resistance of such diodes, since the forward voltage is applied, said series resistance is merely a forward resistance. Accordingly, the value of resistance is remarkably reduced in comparison with the conventional variable capacitance diode in which the backward voltage is applied. Thus, said performance index Q is greatly increased in comparison with the conventional one.

Next, as to a leakage current, since the dielectric layer 3 is disposed between the electrodes 4, 5, no current other than a current for charging the capacitor flows between the electrodes 4, 5.

The semiconductor variable capacitance diode according to the present invention or a semiconductor device including one connected with the power source 6 in the form as shown in FIG. 4 has highly superior characteristics as described above.

A method of producing such the semiconductor variable capacitance diode will be below described.

A silicon P-type semiconductor substrate having thickness of about 100 μm and a specific resistance of 1 to 6Ω.cm, preferably 2 to 6Ω.cm, is used as the P-type semiconductor layer 1 and a silicon N-type semiconductor having a specific resistance of 1 to 6Ω.cm, preferably 1 to 5Ω.cm, is formed with a thickness of 10 μm to be used as the N-type semiconductor layer 2.

Then, a $SiO_2$ layer with a thickness of 2,000 Å is formed on the N-type semiconductor layer 2 by the thermal oxidation method to be used as the dielectric layer 3. The electrode 4 is formed on an upper surface of the dielectric layer 3 by the vapor coating method while the electrode 5 is formed on a surface of the P-type semiconductor substrate by the vapor coating method.

The characteristics shown in FIG. 6 are the results of measurement in the above described preferred embodiment in which said area of the electrodes 4, 5 is 0.25 $cm^2$.

Figure 7:
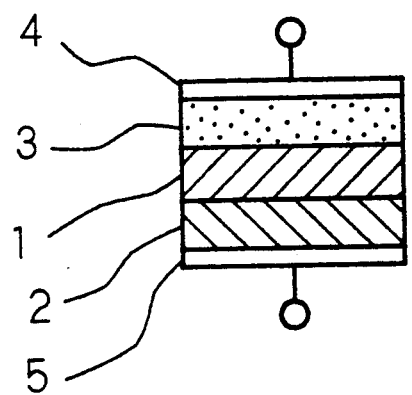
FIG. 7 is a schematic sectional view showing a second preferred embodiment of a semiconductor variable capacitance diode according to the present invention.
Figure 8:
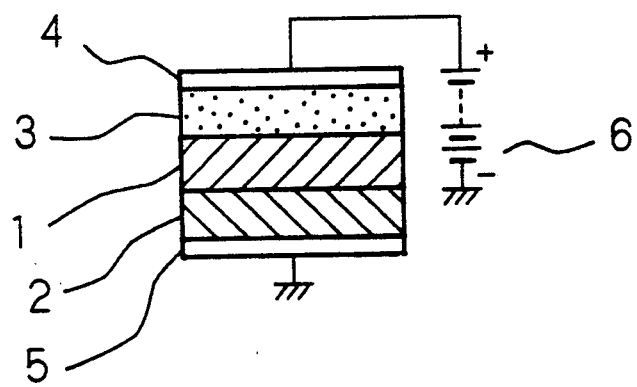
FIG. 8 is a schematic sectional view showing a connecting condition of said semiconductor variable capacitance diode according to said second preferred embodiment of the present invention with a power source.

FIG. 7 shows another preferred embodiment in which relation of the P-type semiconductor layer 1 and the N-type semiconductor layer 2 to the dielectric layer 3 is opposite to that in the preferred embodiment shown in FIG. 3. That is to say, the electrode 5, the N-type semiconductor layer 2, the P-type semiconductor layer 1, the dielectric layer 3 and the electrode 4 are laminated in the described order. In this case, the power source 6 is connected so that the electrode 4 may be positive and the electrode 5 may be negative to apply the forward voltage, as shown in FIG. 8.

Electrons, which have been injected from the side of the N-type semiconductor 2, are collected on a boundary surface of the dielectric layer 3 and the P-type semiconductor layer 1 to form a capacitor with the dielectric layer 3 between said boundary surface of the dielectric layer 3 and the P-type semiconductor layer 1 and the electrode 4. The characteristics are quite the same as those in the preferred embodiment shown in FIGS. 3, 4 and the increased ratio of a change of capacitance, the increased performance index Q and the leakage current close to 0 can be obtained.

It is sufficient that the semiconductor variable capacitance diode according to the present invention has such construction that the application of the forward voltage leads to the formation of the capacitor by the holes or electrons collected on one side of the dielectric layer as described above.

The material of the dielectric layer 3 is not limited to $SiO_2$, and other dielectric materials such as $Al_2O_3$, $Si_3N_4$ can be used. A laminated body consisting of them can be also used.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A semiconductor variable capacitance diode comprising a semiconductor body having a layer of a semiconductor material of a first conductivity type and a layer of a semiconductor material of a second conductivity type different from the first conductivity type, a layer of dielectric material on one of said semiconductor layers of said body, and a pair of electrodes for applying a voltage to said dielectric layer and the other of said semiconductor layers of said semiconductor body to forward bias said other semiconductor layer, a capacitance being formed between the electrode on the dielectric layer and a boundary surface between the dielectric layer and the one layer of semiconductor material in response to the application of the forward bias voltage, the capacitance having a value which increases as the forward biasing voltage increases.

2. A semiconductor variable capacitance diode as set forth in claim 1, wherein the dielectric layer is of at least one material selected from a group consisting of $SiO_2$, $Si_3N_4$ and $Al_2O_3$.

3. A semiconductor variable capacitance diode comprising a first electrode, a P-type semiconductor layer, an N-type semiconductor layer, a dielectric layer and a second electrode laminated in the described order, a forward bias voltage to be supplied relative to the said P-type semiconductor layer as applied across said electrodes.

4. A semiconductor variable capacitance diode as set forth in claim 3, wherein said dielectric layer is of at least one material selected from a group consisting of $SiO_2$, $Si_3N_4$ and $Al_2O_3$.

5. A semiconductor variable capacitance diode as set forth in claim 3, wherein said P-type semiconductor layer and said N-type semiconductor layer are of silicon and have a specific resistance of 1 to 6 ohm-cm.

6. A semiconductor variable capacitance diode comprising a first electrode, an N-type semiconductor layer, a P-type semiconductor layer, a dielectric layer and a second electrode laminated in the described order, a forward bias voltage to be supplied relative to said N-type semiconductor layer as applied across said electrodes.

7. A semiconductor variable capacitance diode as set forth in claim 6, wherein said dielectric layer is of at least one material selected from a group consisting of $SiO_2$, $Si_3N_4$ and $Al_2O_3$.

8. A semiconductor variable capacitance diode as set forth in claim 6, wherein said P-type semiconductor layer and said N-type semiconductor layer are of silicon and have a specific resistance of 1 to 6 ohm-cm.

9. A semiconductor variable capacitance diode comprising a laminated body of two layers of semiconductor material of opposite conductivity type, a dielectric layer formed on one of said semiconductor layers of said laminated body and a pair of electrodes for applying a voltage to said dielectric layer and the other of said semiconductor layers for applying a forward biasing voltage relative to said other semiconductor layer of said laminated body.

10. A semiconductor variable capacitance diode comprising a first electrode, a P-type semiconductor layer, an N-type semiconductor layer, a dielectric layer and a second electrode laminated in the described order to be operable from a power source for applying a forward bias voltage relative to said P-type semiconductor layer.

11. A semiconductor variable capacitance diode comprising a first electrode, an N-type semiconductor layer, a P-type semiconductor layer, a dielectric layer and a second electrode laminated in the described order to be operable from a power source for applying a forward bias voltage relative to said N-type semiconductor layer.

12. A semiconductor variable capacitance diode comprising:
first and second layers of semiconductor materials of different conductivity type, and a layer of dielectric material on said first semiconductor layer,
a pair of electrodes, one on said dielectric layer and the other on said second semiconductor layer to apply a forward bias voltage to said second semiconductor layer to move electrical charges therefrom to the boundary surface of the dielectric layer and the first semiconductor layer to effectively form an electrode of a capacitor also including said dielectric layer and said one electrode of the pair of electrodes, the capacitance of the capacitor increasing with the increase of the forward biasing voltage.

* * * * *